(12) United States Patent
Bielmeier et al.

(10) Patent No.: US 10,663,538 B2
(45) Date of Patent: May 26, 2020

(54) MONITORING OF A TEMPORAL CHANGE IN A MAGNETIC FIELD IN A MAGNETIC RESONANCE DEVICE

(71) Applicants: Wolfgang Bielmeier, Erlangen (DE);
Gerhard Brinker, Erlangen (DE);
Swen Campagna, Engelthal (DE);
Nikolaus Demharter, Dormitz (DE);
Bernd Erbe, Lauf a.d. Pegnitz (DE);
Matthias Gebhardt, Erlangen (DE);
Helmut Lenz, Oberasbach (DE);
Jürgen Nistler, Erlangen (DE);
Dominik Paul, Bubenreuth (DE);
Carsten Prinz, Baiersdorf (DE);
Gudrun Ruyters, Erlangen (DE);
Stephan Stöcker, Baiersdorf (DE);
Markus Vester, Nürnberg (DE)

(72) Inventors: Wolfgang Bielmeier, Erlangen (DE);
Gerhard Brinker, Erlangen (DE);
Swen Campagna, Engelthal (DE);
Nikolaus Demharter, Dormitz (DE);
Bernd Erbe, Lauf a.d. Pegnitz (DE);
Matthias Gebhardt, Erlangen (DE);
Helmut Lenz, Oberasbach (DE);
Jürgen Nistler, Erlangen (DE);
Dominik Paul, Bubenreuth (DE);
Carsten Prinz, Baiersdorf (DE);
Gudrun Ruyters, Erlangen (DE);
Stephan Stöcker, Baiersdorf (DE);
Markus Vester, Nürnberg (DE)

(73) Assignee: Siemens Healthcare GmbH, Erlangen (DE)

(*) Notice: Subject to any disclaimer, the term of this patent is extended or adjusted under 35 U.S.C. 154(b) by 231 days.

(21) Appl. No.: 15/700,124

(22) Filed: Sep. 9, 2017

(65) Prior Publication Data
US 2018/0074138 A1 Mar. 15, 2018

(30) Foreign Application Priority Data

Sep. 9, 2016 (DE) .................. 10 2016 217 223

(51) Int. Cl.
*G01R 33/24* (2006.01)
*G01R 33/385* (2006.01)
*G01R 33/28* (2006.01)

(52) U.S. Cl.
CPC .......... *G01R 33/24* (2013.01); *G01R 33/288* (2013.01); *G01R 33/385* (2013.01)

(58) Field of Classification Search
None
See application file for complete search history.

(56) References Cited

U.S. PATENT DOCUMENTS 6,377,043 B1 * 4/2002 Aldefeld ............ G01R 33/3852
324/307
7,259,560 B2 * 8/2007 Yamanaka ............ G01R 33/28
324/307

(Continued)

FOREIGN PATENT DOCUMENTS

DE  102014202183 A1  8/2015
DE  102014207100 A1  10/2015
DE  102015216323 A1  3/2017

OTHER PUBLICATIONS

Hanke, Manuela. "International Standard Medical Device Software—Software life cycle processes" ICEI IEC 62304; First edition; May 2006.

(Continued)

*Primary Examiner* — Jermele M Hollington
(74) *Attorney, Agent, or Firm* — Lempia Summerfield Katz LLC

(57) ABSTRACT

A method for monitoring a temporal change in a magnetic field in a magnetic resonance device, as well as an evalua- (Continued)

tion unit, a magnetic resonance device, and a computer program product for performing the method are provided. The method provides that a position-dependent magnetic field distribution that is produced by the plurality of gradient coils is provided with a plurality of monitoring points. In addition, time-dependent gradient values of the plurality of gradient coils are ascertained. Based on position-dependent magnetic field distribution and the time-dependent gradient values, the temporal change in the magnetic field is ascertained. The temporal change in the magnetic field is monitored by comparing the temporal change in the magnetic field with at least one limit value.

23 Claims, 6 Drawing Sheets

(56) References Cited

U.S. PATENT DOCUMENTS

| | | | | |
|---|---|---|---|---|
| 7,412,278 | B2* | 8/2008 | Harvey | A61B 5/055 |
| | | | | 324/307 |
| 8,508,227 | B2* | 8/2013 | Haas | G01R 33/3415 |
| | | | | 324/307 |
| 9,329,254 | B2* | 5/2016 | Pfeuffer | G01R 33/56563 |
| 2010/0308829 | A1* | 12/2010 | Vu | G01R 33/288 |
| | | | | 324/314 |
| 2011/0037467 | A1* | 2/2011 | Tsuda | G01R 33/3806 |
| | | | | 324/309 |
| 2013/0162250 | A1 | 6/2013 | Sabate et al. | |
| 2014/0084926 | A1* | 3/2014 | Amthor | G01R 33/4808 |
| | | | | 324/309 |
| 2015/0219736 | A1 | 8/2015 | Niederlohner et al. | |
| 2015/0293190 | A1 | 10/2015 | Paul et al. | |
| 2017/0059670 | A1* | 3/2017 | Gebhardt | G01R 33/24 |

OTHER PUBLICATIONS

Strohm, Hannah. "International Standard Medical Electrical Equipment" IEC 60601-2-33, Edition 3.0; 2010.
Barmet Christoph et al: "Spatiotemporal Magnetic Field Monitoring for MR"; Magnetic Resonance in Medicine vol. 60; pp. 187-197; 2008.
Bartusek K. et al: "Determination of pre-emphasis constants for eddy current reduction"; In: Measurement Science and Technology; vol. 21; pp. 105601-1-105601-9; 2010.
German Office Action for related German Application No. 10 2016 217 223.9 dated Apr. 24, 2018.

* cited by examiner

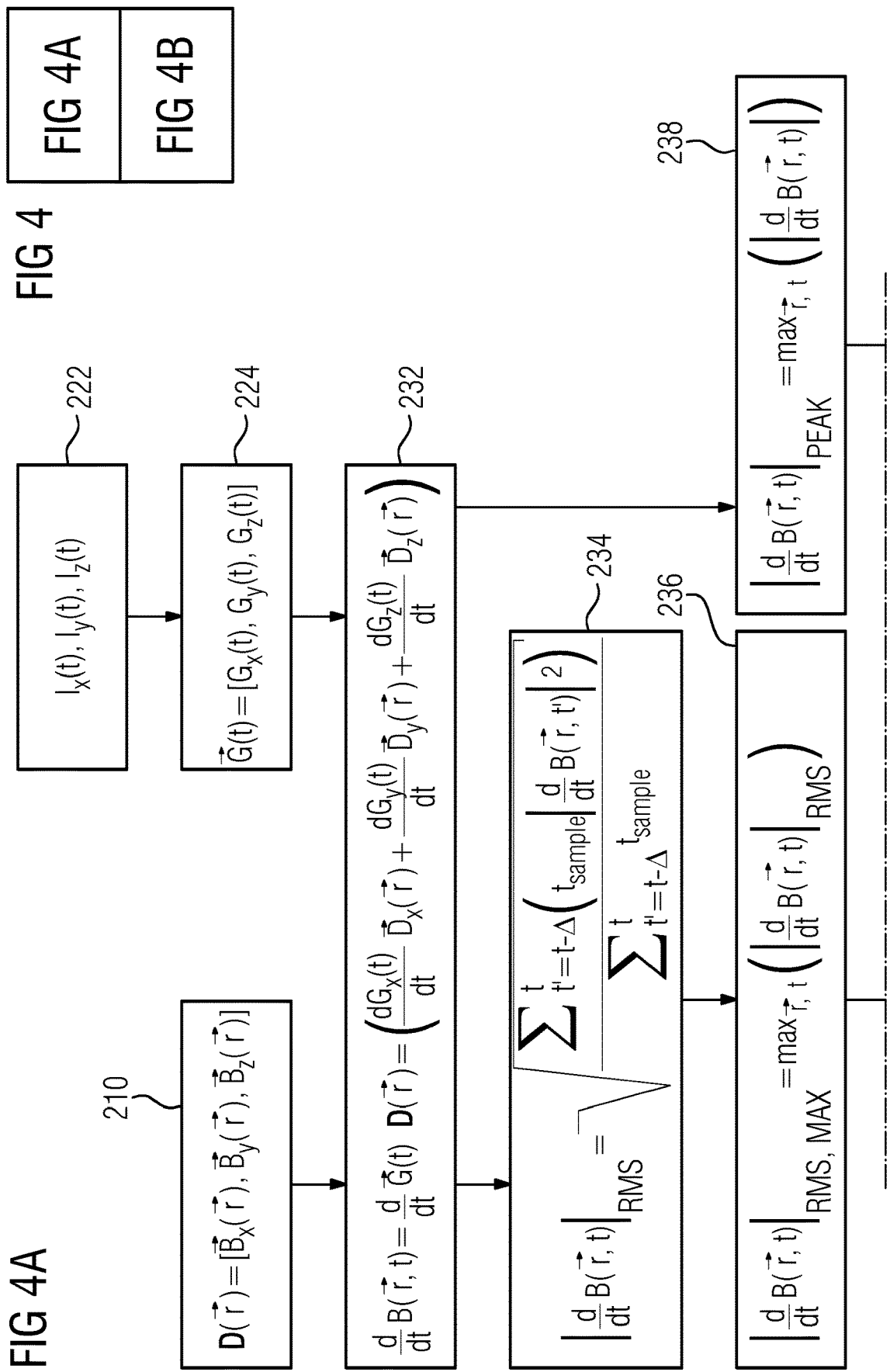

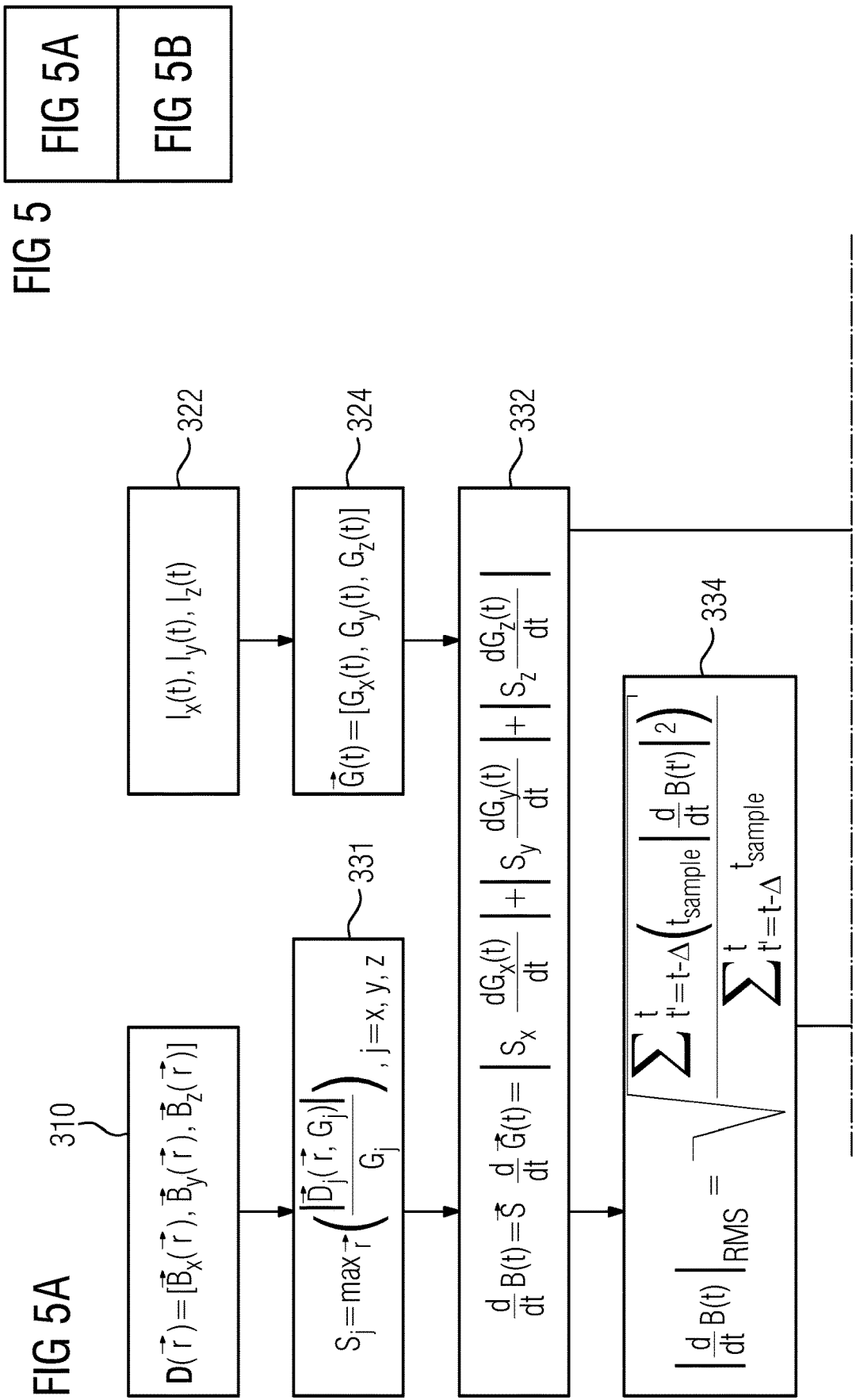

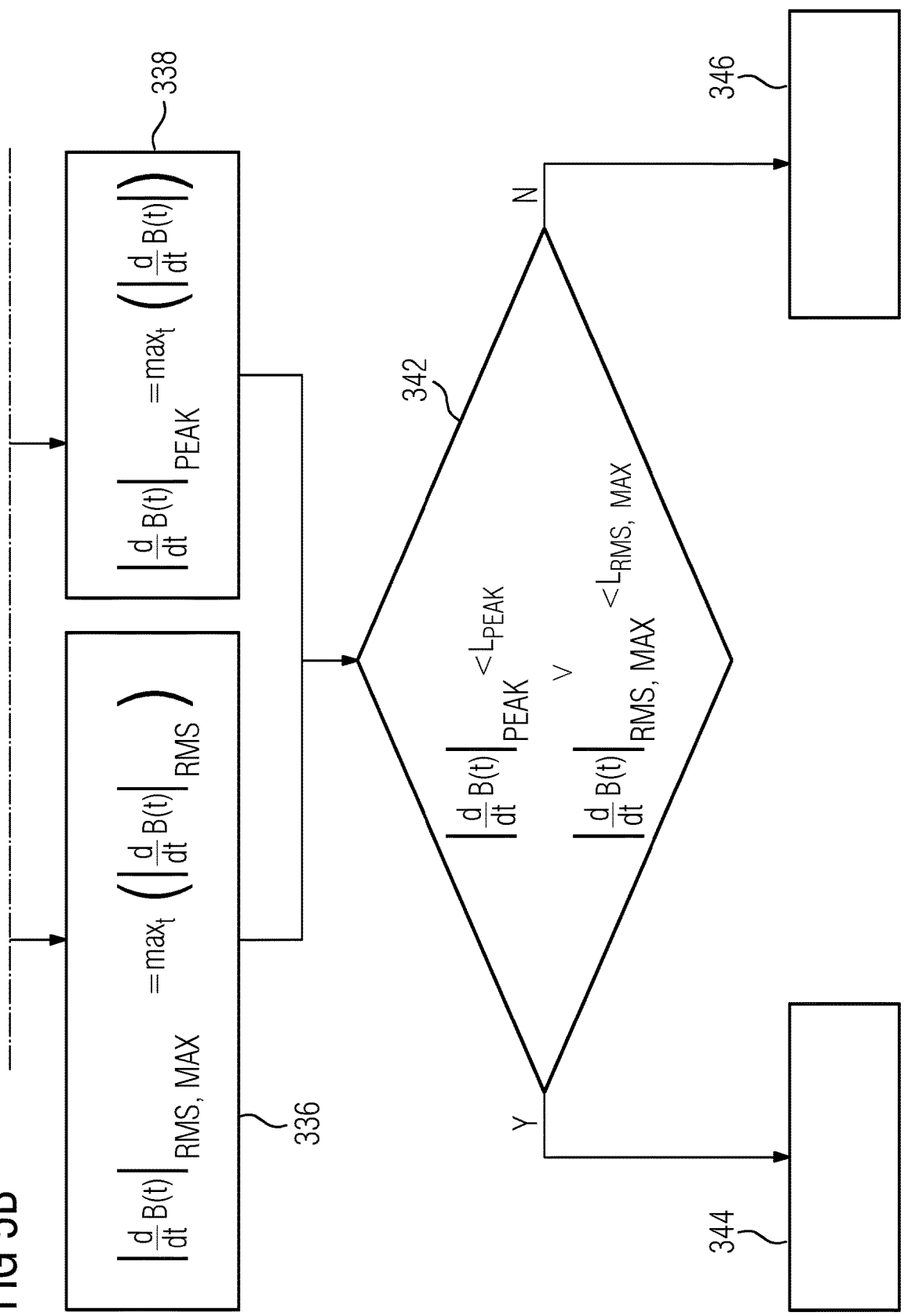

MONITORING OF A TEMPORAL CHANGE IN A MAGNETIC FIELD IN A MAGNETIC RESONANCE DEVICE

This application claims the benefit of DE 10 2016 217 223.9, filed on Sep. 9, 2016, which is hereby incorporated by reference in its entirety.

BACKGROUND

The present embodiments relate to monitoring a temporal change in a magnetic field in a magnetic resonance device.

During the magnetic resonance measurement (e.g., during the performance of Magnetic Resonance Imaging (MRI)) of a patient, rapidly switched gradient pulses are customarily applied by a magnetic resonance device, and gradient fields are thus generated. The magnetic resonance device customarily has a gradient coil unit with a plurality of gradient coils to generate the gradient fields. Usually, the magnetic resonance device includes three gradient coils that are configured to generate magnetic field gradients perpendicular to each other (e.g., an x-gradient coil that may generate a magnetic field gradient in an x-direction, a y-gradient coil that may generate a magnetic field gradient in a y-direction, and a z-gradient coil that may generate a magnetic field gradient in a z-direction).

The gradient pulses may produce Peripheral Nerve Stimulation (PNS) in the patient's body as soon as certain field change thresholds are exceeded. In a study of patients with implants (e.g., neurostimulators and/or cardiac pacemakers), there are particularly high risks, such as, for example, tachycardia as a result of stimulation of the heart and/or burns of nervous tissue. Therefore, standardization bodies require monitoring and/or restriction of field change. For example, in a magnetic resonance scan of implant wearers, the IEC 60601-2-33 standard provides that a temporal change in a magnetic field in a magnetic resonance device may not exceed a peak value $|dB/dt|_{PEAK,limit}$ of 100 T/s and an average value $|dB/dt|_{RMS,limit}$ of 56 T/s.

SUMMARY AND DESCRIPTION

The scope of the present invention is defined solely by the appended claims and is not affected to any degree by the statements within this summary.

The present embodiments may obviate one or more of the drawbacks or limitations in the related art. For example, the temporal change in the magnetic field in a magnetic resonance device is monitored safely and efficiently.

A method for monitoring a temporal change in a magnetic field in a magnetic resonance device with a plurality of gradient coils is provided. A position-dependent magnetic field distribution produced by the plurality of gradient coils is provided with a plurality of monitoring points. The position-dependent magnetic field distribution therefore includes a distribution of the magnetic field at the positions of the plurality of monitoring points.

In addition, time-dependent gradient values (e.g., time-dependent gradient strengths) of the plurality of gradient coils are ascertained. Based on the position-dependent magnetic field distribution and the time-dependent gradient values, the temporal change in the magnetic field is ascertained. The temporal change in the magnetic field is monitored by comparing the temporal change in the magnetic field with at least one limit value.

A gradient coil customarily has the task of converting an impressed current into a gradient field (e.g., a spatially changing magnetic field, the strength of which increases or decreases in linear fashion in a predetermined direction, often in the direction of Cartesian coordinates x, y, and z). A gradient coil may therefore be assigned a gradient axis (e.g., an x-gradient coil, a gradient axis x, etc.). A magnetic resonance device therefore includes a plurality of (e.g., three) separate gradient coils that are driven by separate gradient amplifiers (e.g., current amplifiers). The plurality of gradient coils may be integrated into a gradient coil unit (e.g., a tubular gradient coil unit).

The location-dependent magnetic field distribution including a plurality of monitoring points may be provoked by operating the plurality of gradient coils. The magnetic field distribution may indicate a vector of a magnetic field strength at each monitoring point for each of the plurality of gradient coils. The location-dependent magnetic field distribution may therefore also be interpreted as a coil-dependent spatial sensitivity of the magnetic field. The magnetic field distribution may be ascertained by simulating the field of the gradient coils. This simulation may be performed with the aid of any simulation unit that may, for example, include one or more processors. In one embodiment, this possibly time-consuming ascertainment of the position-dependent magnetic field distribution takes place before a magnetic resonance scan, during a development, and/or during a commissioning of a magnetic resonance device. The location-dependent magnetic field distribution therefore is only to be provided during the magnetic resonance scan. The location-dependent magnetic field distribution may be stored in a storage device for this purpose.

The time-dependent gradient values may determine the temporal behavior of the magnetic field at the monitoring points. The time-dependent gradient values may be produced for each of the gradient coils via time-dependent control of the gradient coils. The ascertainment of the time-dependent gradient values and/or of the temporal change in the magnetic field based on position-dependent magnetic field distribution and the time-dependent gradient values may, for example, take place with the aid of an evaluation unit including, for example, at least one processor. The position-dependent magnetic field distribution may be made available for the evaluation unit by being transferred, for example, from a database to the evaluation unit.

The ascertained temporal change in the magnetic field may, for example, with the aid of the evaluation unit, be compared to at least one limit value that, for example, is specified by a standard.

The ascertained temporal change in the magnetic field may include all variables that may characterize the dynamic behavior of the magnetic field, such as, for example, peak values and/or average values (e.g., Root Mean Squares (RMS)). The ascertained temporal change in the magnetic field may therefore, for example, include not only a magnetic field change in a single position at a single time produced by a single gradient coil, but also any combination of resulting values. As a result, the ascertained temporal change in the magnetic field may be reacted to appropriately.

The method may be performed at least partially before the magnetic resonance measurement to provide anticipatorily that a planned magnetic resonance measurement does not lead to a breach of the at least one limit value. For example, it may be provided that only in this case (e.g., in compliance with the at least one limit value) the planned magnetic resonance measurement is initiated. Conversely, if an overrun is established, a warning message may be output.

However, the method may also be performed at least partially during a magnetic resonance measurement. In doing so, for example, in the event of exceeding the at least one limit value, an operating mode of the magnetic resonance device is changed. For example, the operating mode is switched from a measuring mode to a secure operating mode by, for example, not applying any gradient pulses. Advantageously, possible gradient currents for operating the gradient coils are not simply switched off abruptly as this may lead to an undesirable final pronounced change in the magnetic field. Instead, the magnetic field is preferably monitored and/or shut down in a well-determined manner. Changing the operating mode and/or outputting the warning message may be controlled by the evaluation unit.

One embodiment provides that the plurality of monitoring points are at a distance of less than 10 cm (e.g., 5 cm) from a housing of the magnetic resonance device that at least partially encloses a patient reception area. The distance may, for example, be constant.

Magnetic resonance devices may include a tunnel-shaped patient reception area (e.g., a magnet bore). This is customarily radially limited by the housing of the magnetic resonance device. Axially the patient reception area may be open in at least one direction (e.g., in both directions) to introduce the patient into the patient reception area and enable positioning there.

Advantageously, the plurality of monitoring points (e.g., in a tunnel-shaped patient reception area) are located on a cylinder surface (e.g., on the barrel surface of a cylinder with a diameter smaller than the diameter of the cylinder). The diameter of the cylinder may be the diameter of the tunnel-shaped patient reception area minus double the aforementioned distance between the housing of the magnetic resonance device and the plurality of monitoring points.

The distance between the plurality of monitoring points and the housing of the magnet bore may be small (e.g., 5 cm). As the change in a magnetic field customarily decreases from the outside to the inside, for an estimate of the worst-case scenario, it is sufficient to only calculate the position-dependent magnetic field distribution for monitoring points located close to the housing of the magnet bore (e.g., externally). Thereby, the calculation effort may be reduced.

One embodiment provides that the position-dependent magnetic field distribution for at least one (e.g., each) of the plurality of monitoring points and for at least one (e.g., each) of the plurality of gradient coils includes a magnetic field distribution vector that characterizes a magnetic field (e.g., a proportion of a total magnetic field) that is produced by the respective gradient coil at the respective monitoring point. This view enables efficient processing of position-dependent magnetic field distribution.

For example, a magnetic field that is produced by an x-gradient coil may be characterized by a magnetic field distribution vector $\vec{D}_x(r)$, a magnetic field that is produced by a y-gradient coil may be characterized by a magnetic field distribution vector $\vec{D}_y(r)$, and a magnetic field that is produced by a z-gradient coil may be characterized by a magnetic field distribution vector $\vec{D}_z(r)$, where r is the position of a monitoring point. The physical unit of the components of the magnetic field distribution vector $\vec{D}_x(r)$ may be T/(T/m)=m.

The position-dependent magnetic field distribution for at least one (e.g., each) of the plurality of monitoring points may include a matrix. Matrix elements of the matrix include components of the magnetic field distribution vectors. Such a presentation enables the efficient processing of position-dependent magnetic field distribution.

For example, the position-dependent magnetic field distribution for each monitoring point that is characterized by a position r may include a 3×3 matrix $D(\vec{r})=[\vec{D}_x(r),\vec{D}_y(r),\vec{D}_z(r)]$ with the magnetic field distribution vectors $\vec{D}_x(r)$, $\vec{D}_y(r)$ and $\vec{D}_z(r)$.

In one embodiment, a time-dependent gradient current is measured for at least one (e.g., each) of the plurality of gradient coils. The time-dependent gradient values are ascertained based on the time-dependent gradient currents. The time-dependent gradient currents may be measured with the aid of current sensors.

For example, a gradient value $G_x(t)$ may be ascertained from a measured gradient current $I_x(t)$ of the x-gradient coil, a gradient value $G_y(t)$ may be ascertained from a measured gradient current $I_y(t)$ of the y-gradient coil, and a gradient value $G_z(t)$ may be ascertained from a measured gradient current $I_z(t)$ of the z-gradient. The physical unit of the gradient value may be T/m. In short, the time-dependent gradient value may be written as vector $\vec{G}(t)$ [$G_x(t)$, $G_y(t)$, $G_z(t)$]. Such a presentation enables the efficient processing of the time-dependent gradient values.

Customary gradient amplifiers already include current sensors for controlling and/or monitoring gradient currents. A feedback loop may be used. The current sensors may be used for consistency monitoring with the aid of additional redundant sensors.

The time-dependent gradient current may be measured with the aid of at least one magnetic field sensor. A magnetic field in the immediate vicinity for conducting the gradient current may be measured by the at least one magnetic field sensor (e.g., a flux-gate magnetometer). From the magnetic field, the gradient current may be ascertained.

One embodiment of the method provides that a position-dependent time-derivative value of the magnetic field is ascertained in order to ascertain the temporal change in the magnetic field for at least one (e.g., each) of the plurality of monitoring points in each case. With the aid of a position-dependent time-derivative value, the estimate of the temporal change in the magnetic field may be performed with particular precision, as the estimation takes place separately for each position of the monitoring points. For example, any spatial peculiarities and/or asymmetries of the sensitivity of the gradient coils may therefore be taken into account.

The time-derivative value is customarily not only position-dependent (e.g., a function of the position), but also time-dependent (e.g., a function of time).

For example, dB(r,t)/dt may be calculated as a position-dependent time-derivative value of the magnetic field with the aforementioned variables by:

$$\frac{d}{dt}\vec{B}(\vec{r},t) = \frac{d}{dt}\vec{G}(t)\cdot D(\vec{r}) = \left(\frac{dG_x(t)}{dt}\vec{D}_x(\vec{r}) + \frac{dG_y(t)}{dt}\vec{D}_y(\vec{r}) + \frac{dG_z(t)}{dt}\vec{D}_z(\vec{r})\right)$$

In one embodiment, at least one position-dependent variation average value is ascertained for at least one (e.g., all) of the plurality of monitoring points based on the one position-dependent time-derivative value of the magnetic field respectively over a plurality of measurement times.

The measurement times are advantageously within the period of magnetic resonance measurement to be monitored.

For example, $(|dB(r,t)/dt|_{RMS})$ may be calculated as a position-dependent variation average value with the aforementioned variables by:

$$\left|\frac{d}{dt}B(\vec{r},t)\right|_{RMS} = \sqrt{\frac{\sum_{t'=t-\Delta}^{t}\left(t_{sample}\left|\frac{d}{dt}B(\vec{r},t')\right|^2\right)}{\sum_{t'=t-\Delta}^{t}t_{sample}}}$$

In one embodiment, $\Delta$ is an appropriate period over which averaging is performed (e.g., 6 min). $t_{sample}$ may be the duration of a step between two consecutive measurement times. The period of magnetic resonance measurement to be monitored may be divided into a finite number of measurement times by the steps $$t_{sample} \cdot \sum_{t'=t-\Delta}^{t} t_{sample}$$

may, for example, be the period of magnetic resonance measurement to be monitored.

An advantageous sampling rate (e.g., the inverse duration of a step) may be greater than 1 kHz (e.g., 5 kHz) for sufficiently precise sampling. Such a sampling rate corresponds to steps smaller than 1 ms (e.g., 0.2 ms). The sampling rate may not be too high to avoid particularly disruptive effects of a ripple of the gradient amplifier.

A position-dependent variation peak value of the position-dependent time-derivative value of the magnetic field and/or a maximum position-dependent variation average value of the at least one variation average value may be ascertained for at least one (e.g., all) of the plurality of monitoring points and/or for at least one (e.g., all) of the measurement times.

For example, $|dB(r,t)/dt|_{PEAK}$ may be calculated as a position-dependent variation peak value of the position-dependent time-derivative value of the magnetic field with the aforementioned variables in accordance with:

$$\left|\frac{d}{dt}B(\vec{r},t)\right|_{PEAK} = \max_{\vec{r},t}\left(\left|\frac{d}{dt}B(\vec{r},t)\right|\right)$$

The maximum of $|dB(r,t)/dt|$ is therefore ascertained across all positions r of the monitoring points and over all measurement times t.

For example, $|dB(r,t)/dt|_{RMS,MAX}$ may be calculated as a maximum position-dependent variation average value of the at least one variation average value $|dB(r,t)/dt|_{RMS}$ with the aforementioned variables in accordance with:

$$\left|\frac{d}{dt}B(\vec{r},t)\right|_{RMS,MAX} = \max_{\vec{r},t}\left(\left|\frac{d}{dt}B(\vec{r},t)\right|_{RMS}\right)$$

The maximum of $|dB(r,t)/dt|_{RMS}$ is therefore ascertained across all positions r of the monitoring points and over all measurement times t.

During monitoring of the temporal change in the magnetic field, the at least one position-dependent variation peak value and/or the at least one maximum position-dependent variation average value may be compared to the at least one limit value.

If the at least one limit value includes, for example, a limit value for the at least one position-dependent variation peak value 100 T/s, then a possible test condition is:

PEAK<100 T/s

If the at least one limit value includes, for example, a limit value for the at least one maximum position-dependent variation average value 56 T/s, then a possible test condition is:

$$\left|\frac{d}{dt}B(\vec{r},t)\right|_{RMS,MAX} < 56 \text{ T/s}$$

A further embodiment of the method provides that a position-independent time-derivative value of the magnetic field is ascertained to ascertain the temporal change in the magnetic field for at least one (e.g., all) of the plurality of monitoring points. The position-independent time-derivative value may therefore not be a function of the position of an individual monitoring point, but a global variable across all the monitoring points.

With the aid of a position-independent time-derivative value, the estimate of the temporal change in the magnetic field may be performed particularly rapidly, as in doing so, a lengthy calculation for one or more (e.g., all) of the monitoring points may be omitted.

A scaling factor may be provided to ascertain the position-independent time-derivative value for at least one (e.g., each) of the plurality of gradient coils, while at the same time, a maximum of the magnetic field distribution (e.g., an amount of the magnetic field distribution of at least one of the plurality of monitoring points is ascertained in order to ascertain the scaling factors).

For this variant, the spatial dependency is removed with the aid of the assumption that the maximum change in the magnetic field for each of the gradient coils occurs at the same position in the room. In addition, it is also assumed that the field vectors produced by the various gradient coils point in the same direction. This is a very conservative assumption that results in a worst-case scenario of the change in the magnetic field.

For example, $S_j$, j=x,y,z may be calculated as scaling factors with the aforementioned variables in accordance with:

$$S_j = \max_{\vec{r}}\left(\frac{|\vec{D}_j(\vec{r},G_j)|}{G_j}\right), j = x, y, z$$

The scaling factors may be written as S $[S_x, S_y, S_z]$ vectors. $S_j$, j=x,y,z indicates a proportionality between the applied gradient value of the j-gradient coil and the maximum of the position-dependent magnetic field distribution for the monitoring points at the r positions. For example, a maximum gradient field value is ascertained for each gradient axis. The scaling factors are customarily properties of the respective gradient coil and may be stored as fixed values in a storage device and provided as required.

As a position-independent time-derivative value, for example, dB(r)/dt may be calculated by:

$$\frac{d}{dt}B(t) = \vec{S} \cdot \frac{d}{dt}\vec{G}(t) = \left|S_x \cdot \frac{dG_x(t)}{dt}\right| + \left|S_y \cdot \frac{dG_y(t)}{dt}\right| + \left|S_z \cdot \frac{dG_z(t)}{dt}\right|$$

The maximum absolute values of the temporal change in the magnetic field that are produced by the respective gradient coil are added up arithmetically.

A spatial worst-case scenario of dB/dt is thus performed by adding up the amount of the maximum of the magnetic fields produced by each gradient coil at each measurement time and calculating the time derivative.

Analogous to the statements about the position-dependent time-derivative value, at least one position-independent variation average value is ascertained based on the position-independent time-derivative value of the magnetic field over a plurality of measurement times.

For example, $(|dB(r)/dt|_{RMS})$ may be calculated as a position-independent variation average value with the aforementioned variables by:

$$\left|\frac{d}{dt}B(t)\right|_{RMS} = \sqrt{\frac{\sum_{t'=t-\Delta}^{t}\left(t_{sample}\left|\frac{d}{dt}B(t')\right|^2\right)}{\sum_{t'=t-\Delta}^{t} t_{sample}}}$$

$\Delta$ may be an appropriate period over which ascertainment takes place (e.g., 6 min). An advantageous sampling rate (e.g., the inverse duration of a step) may be greater than 1 kHz (e.g., 5 kHz).

In one embodiment, a position-independent variation peak value of the position-dependent time-derivative value of the magnetic field and/or a maximum position-dependent variation average value of the at least one variation average value are ascertained for at least one (e.g., all) of the measurement times. The aforementioned measurement times may be within the period of magnetic resonance measurement to be monitored.

For example, precisely one global variation average value and/or precisely one global variation peak value that apply to all of the plurality of monitoring points may be ascertained based on the scaling factors.

For example, $|dB(r)/dt|_{PEAK}$ may be calculated as a position-independent variation peak value of the position-independent time-derivative value of the magnetic field with the aforementioned variables by:

$$\left|\frac{d}{dt}B(t)\right|_{PEAK} = \max_t\left(\left|\frac{d}{dt}B(t)\right|\right)$$

The maximum of $|dB(r)/dt|$ over all measurement times t is therefore ascertained.

For example, $|dB(r)/dt|_{RMS,MAX}$ may be calculated as a position-independent variation peak value of the position-independent time-derivative value of the magnetic field with the aforementioned variables by:

$$\left|\frac{d}{dt}B(t)\right|_{RMS,MAX} = \max_t\left(\left|\frac{d}{dt}B(t)\right|_{RMS}\right)$$

The maximum of $|dB(r)/dt|_{RMS}$ over all measurement times t is therefore ascertained.

The at least one position-independent variation peak value and/or the at least one maximum position-independent variation average value may be compared to the at least one limit value during monitoring of the temporal change in the magnetic field.

If the at least one limit value includes, for example, a limit value for the at least one position-independent variation peak value 100 T/s, then a possible test condition is:

$$\left|\frac{d}{dt}B(t)\right|_{PEAK} < 100 \text{ T/s}$$

If the at least one limit value includes, for example, a limit value for the at least one maximum position-dependent variation average value 56 T/s, then a possible test condition is:

RMS,MAX<56 T/s

An evaluation unit with an arithmetic unit for performing a method for monitoring a temporal change in a magnetic field in a magnetic resonance device with a plurality of gradient coils is provided.

For example, an evaluation unit that is configured to ascertain time-dependent gradient values of a plurality of gradient coils, to ascertain a temporal change in a magnetic field based on the ascertained time-dependent gradient values and a position-dependent magnetic field distribution provided and compare the temporal change with at least one limit value is provided.

The advantages of the evaluation unit essentially correspond to the advantages of the method for monitoring a temporal change in a magnetic field in a magnetic resonance device with a plurality of gradient coils, described in detail previously. Features, advantages, or alternative embodiments mentioned here may likewise also be transferred to the other claimed objects and vice versa.

In addition, a magnetic resonance device with an evaluation unit is provided. In one embodiment, the magnetic resonance device includes at least one current sensor for measuring gradient currents.

A computer program product that includes a program and may be loaded directly into a storage device (e.g., a non-transitory computer-readable storage medium) of a programmable arithmetic unit of an evaluation unit and has program resources (e.g., libraries and auxiliary functions) to perform a method for monitoring a temporal change in a magnetic field in a magnetic resonance device with a plurality of gradient coils when the computer program product is executed in the evaluation unit is provided. The computer program product may include software with a source code that is still to be compiled and bound or only is to be interpreted, or an executable software code that is only to be loaded into the evaluation unit for execution. Using the computer program product, the method for monitoring a temporal change in a magnetic field in a magnetic resonance device with a plurality of gradient coils may be performed quickly, robustly, and repeated identically. The computer program product may perform the acts according to the present embodiments using the evaluation unit. The evaluation unit is to meet all the conditions in each case such as, for example, a corresponding working memory, a corresponding graphics card, or a corresponding logic unit, such that the respective acts may be efficiently performed.

BRIEF DESCRIPTION OF THE DRAWINGS

Corresponding elements have the same reference characters in all the figures.

FIGS. 4A and 4B show a detailed block diagram of a first embodiment of the method; and FIGS. 5A and 5B show a detailed block diagram of a second embodiment of the method.

DETAILED DESCRIPTION

Figure 1:
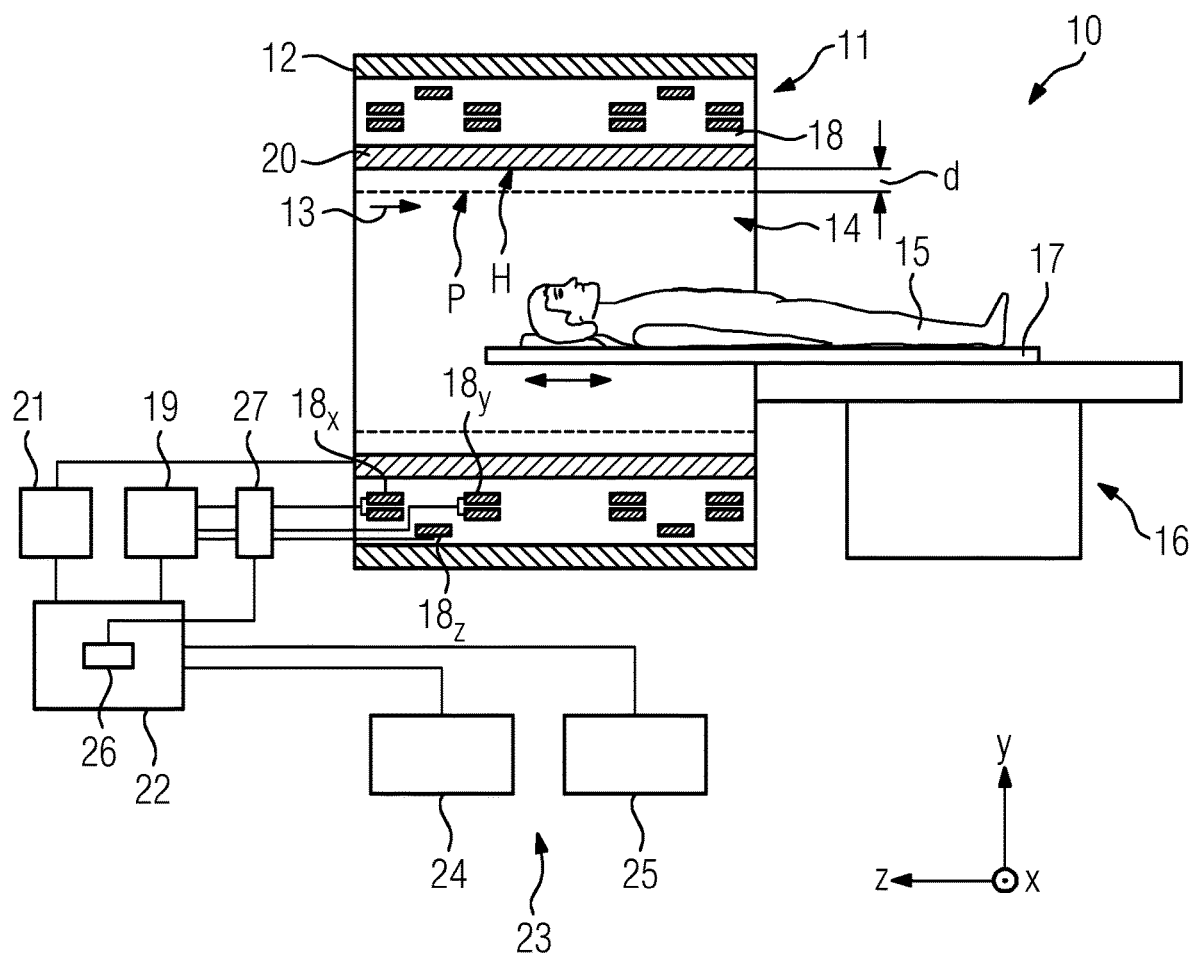
FIG. 1 shows one embodiment of a magnetic resonance device with an evaluation unit in a diagrammatic view.

FIG. 1 is a diagrammatic view of one embodiment of a magnetic resonance device 10. The magnetic resonance device 10 includes a magnet unit 11 having a main magnet 12 for generating a strong and, for example, temporally constant main magnetic field 13. In addition, the magnetic resonance device 10 includes a patient reception area 14 for the reception of a patient 15. The patient reception area 14 in the present exemplary embodiment is cylindrical in design and cylindrically enclosed by the magnet unit 11 in a peripheral direction. In principle, however, a differing design of the patient reception area 14 may be provided. The patient 15 may be pushed into the patient reception area 14 by a patient support device 16 of the magnetic resonance device 10. The patient support device 16 has a patient table 17 that is moveable in design inside the patient reception area 14 for this purpose.

The magnet unit 11 has a gradient coil unit 18 for generating magnetic gradient fields that is used, for example, for spatial encoding during imaging. The gradient coil unit 18 includes, for example, three gradient coils $18_x$, $18_y$, $18_z$ (e.g., corresponding to the coordinate axes, an x, y and z-gradient coil, respectively). To generate the magnetic gradient fields, an electrical gradient current flows through the gradient coils $18_x$, $18_y$, $18_z$ respectively, that is controlled by a gradient control unit 19 of the magnetic resonance device 10. For this purpose, the gradient control unit 19 includes gradient amplifiers not shown here.

The magnet unit 11 also includes a high-frequency antenna unit 20 that, in the present exemplary embodiment, is configured as a body coil permanently integrated into the magnetic resonance device 10. The high-frequency antenna unit 20 is configured for the excitation of atomic nuclei that occurs in the main magnetic field 13 generated by the main magnet 12. The high-frequency antenna unit 20 is controlled by a high-frequency antenna control unit 21 of the magnetic resonance device 10 and beams high frequency magnetic resonance sequences into an examination area that essentially includes a patient reception area 14 of the magnetic resonance device 10. The high-frequency antenna unit 20 is configured to receive magnetic resonance signals.

To control main magnet 12, the gradient control unit 19, and to control the high-frequency antenna control unit 21, the magnetic resonance device 10 has a system control unit 22. The system control unit 22 centrally controls the magnetic resonance device 10, such as, for example, the performance of a predetermined imaging gradient echo sequence. In addition, the system control unit 22 includes a reconstruction unit not described in more detail for the reconstruction of medical image data recorded during magnetic resonance scans. The magnetic resonance device 10 includes a user interface 23 that is linked to the system control unit 22. Control information such as, for example, imaging parameters, and reconstructed magnetic resonance images may be displayed on a display unit 24, for example, on at least one monitor, of the user interface 23 for medical operating personnel. The user interface 23 has an input unit 25 by which information and/or parameters may be input during a measurement process by the medical operating personnel.

The system control unit 22 further includes an evaluation unit 26 with a programmable arithmetic unit that, for example, has one or more processors and/or a storage device. With the evaluation unit, a method for monitoring a temporal change in a magnetic field in a magnetic resonance device 10 with a plurality of gradient coils $18_x$, $18_y$, $18_z$ may be performed. A program, with program resources, may be loaded into the storage device of the programmable arithmetic unit to perform a method for monitoring a temporal change in a magnetic field in the magnetic resonance device 10 with a plurality of gradient coils $18_x$, $18_y$, $18_z$ when the program is executed in the arithmetic unit.

Figure 2:
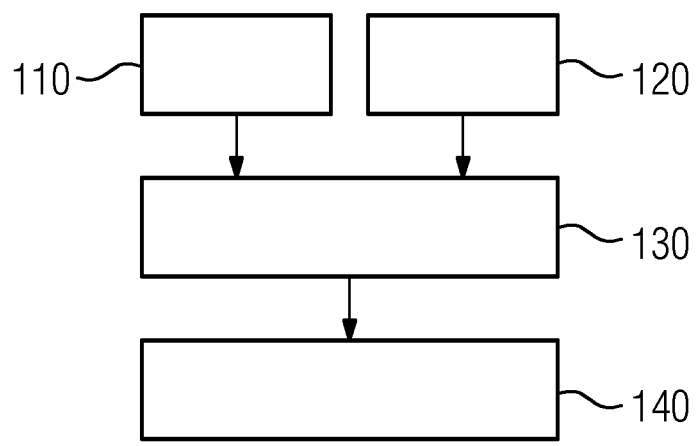
FIG. 2 shows a block diagram of one embodiment of a method.

FIG. 2 shows a block diagram to illustrate a possible method for monitoring a temporal change in a magnetic field in the magnetic resonance device (10) with a plurality of gradient coils $18_x$, $18_y$, $18_z$. In act 110, a position-dependent magnetic field distribution that is produced by the plurality of gradient coils $18_x$, $18_y$, $18_z$ is provided with a plurality of monitoring points P. As shown by way of example in FIG. 1, the plurality of monitoring points P are at a distance d of less than 10 cm from a housing H of the magnetic resonance device 10. The housing H at least partially encloses the patient reception area 14.

In act 120, time-dependent gradient values of the plurality of gradient coils $18_x$, $18_y$, $18_z$ are ascertained. In act 130, a temporal change in the magnetic field is ascertained based on the position-dependent magnetic field distribution and the time-dependent gradient values. In act 140, the temporal change in the magnetic field is monitored by comparing the temporal change in the magnetic field with at least one limit value.

Figure 3:
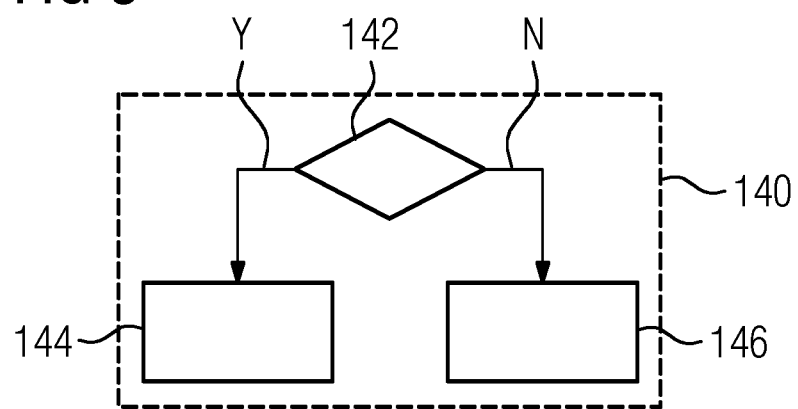
FIG. 3 shows a block diagram of a partial step of the method.

FIG. 3 shows a block diagram specifying a possible way in which the monitoring in act 140 may be performed. A decision act 142 examines whether the temporal change in the magnetic field exceeds the at least one limit value. If this is the case, in act 144, an operating mode of the magnetic resonance device 10 is changed and/or a warning message output. Otherwise, the operating mode in act 146 is retained and/or no warning message is output.

Figure 4B:
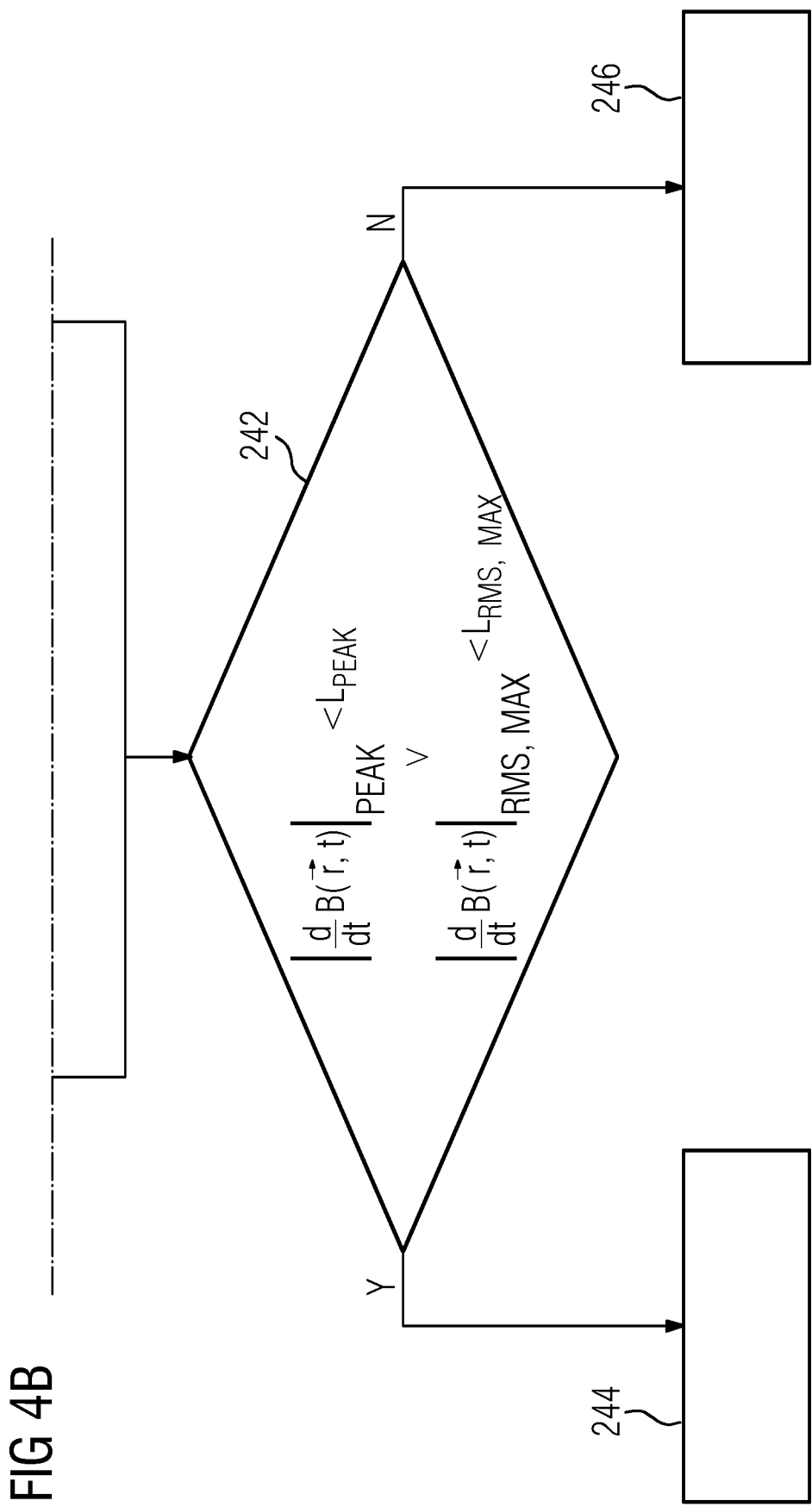

FIGS. 4 and 5 show detailed exemplary embodiments of a method. In the acts 210 and 310, a position-dependent magnetic field distribution D(r) that is produced by the plurality of gradient coils $18_x$, $18_y$, $18_z$ is provided with a plurality of monitoring points P. The positions of the plurality of monitoring points are described by position vectors r.

For at least one (e.g., each) gradient coil of the plurality of gradient coils $18_x$, $18_y$, $18_z$, in each case, the position-dependent magnetic field distribution D(r) includes a magnetic field distribution vector $\vec{D}_x(r)$, $\vec{D}_y(r)$, $\vec{D}_z(r)$ for at least one (e.g., each) of the plurality of monitoring points P. The magnetic field distribution vector $\vec{D}_x(r)$, $\vec{D}_y(r)$, $\vec{D}_z(r)$ characterizes a magnetic field that is produced by the respective gradient coil $18_x$, $18_y$, $18_z$ at the respective monitoring point P (e.g., at the position r of the respective monitoring point P).

The acts 210 and 310 illustrate that the position-dependent magnetic field distribution D(r) for at least one (e.g., each) monitoring point of the plurality of monitoring points P includes a matrix the elements of which include components of the magnetic field distribution vectors $\vec{D}_x(r)$, $\vec{D}_y(r)$, $\vec{D}_z(r)$.

In the acts 224 and 324, time-dependent gradient values $\vec{G}(t)$ of the plurality of gradient coils $18_x$, $18_y$, $18_z$ are ascertained that are, for example, shown as vectors with the components $\vec{G}_x(r)$, $\vec{G}_y(r)$, and $\vec{G}_z(r)$.

The exemplary embodiments shown in FIGS. 4 and 5 include the optional acts 222 and 322 in which a time-dependent gradient current $I_x(t)$, $I_y(t)$, $I_z(t)$ is measured for at least one (e.g., each) gradient coil of the plurality of gradient coils $18_x$, $18_y$, $18_w$. In act 224, the time-dependent gradient values $\vec{G}(t)$ are ascertained based on the time-dependent gradient currents $I_x(t)$, $I_y(t)$, $I_z(t)$.

The time-dependent gradient current $I_x(t)$, $I_y(t)$, $I_z(t)$ may be measured with the aid of at least one current sensor 27 (e.g., a magnetic field sensor), as shown in FIG. 1. The current sensor 27, which may include dedicated part sensors for each gradient coil $18_x$, $18_y$, $18_z$, is advantageously arranged in the immediate vicinity of the supply line of the gradient coils $18_x$, $18_y$, $18_z$ to measure the magnetic field there and deduce the time-dependent gradient currents $I_x(t)$, $I_y(t)$, $I_z(t)$. The evaluation of the gradient currents $I_x(t)$, $I_y(t)$, $I_z(t)$ may, for example, be performed by the gradient control unit 19 (e.g., by gradient amplifiers). However, this may also be performed by a separate unit such as, for example, the evaluation unit 26. The evaluation unit 26 is connected to this with the current sensor 27 such that information about the measured currents may be transmitted to the evaluation unit.

In the acts 232, 324, 236 and 238 of FIG. 4 and the acts 331, 332, 334, 336 and 338 of FIG. 5, in each case, the temporal change in the magnetic field is ascertained based on the position-dependent magnetic field distribution D(r) and the time-dependent gradient values $\vec{G}(t)$.

In act 232 of FIG. 4, to ascertain the temporal change in the magnetic field for at least one (e.g., each) monitoring point of the plurality of monitoring points P, in each case, a position-dependent time-derivative value of the magnetic field dB(r,t)/dt is ascertained. This takes place by, for example, a time derivative of the product of $\vec{G}(t)$ and D(r).

In act 234, for at least one (e.g., all) monitoring point of the plurality of monitoring points P, at least one position-dependent variation average value $|dB(r,t)/dt|_{RMS}$ is ascertained based on each position-dependent time-derivative value of the magnetic field dB(r,t)/dt over a plurality of measurement times t. Averaging takes place over, for example, a period Δ, where $t_{sample}$ is the duration of a step between two consecutive measurement times t.

In act 236, a maximum position-dependent variation average value $(|dB(r,t)/dt|_{RMS,MAX})$ of the at least one variation average value $(|dB(r,t)/dt|_{RMS})$ is ascertained for at least one (e.g., all) of the plurality of monitoring points P that are characterized by corresponding r positions, and/or for at least one (e.g., all) of the measurement times t. In act 238, a position-dependent variation peak value $(|dB(r,t)/dt|_{PEAK})$ of the position-dependent time-derivative value of the magnetic field (dB(r,t)/dt) is ascertained for at least one (e.g., all) of the plurality of monitoring points P that are characterized by corresponding r positions, and/or for at least one (e.g., all) of the measurement times t. The aforementioned measurement times are within the period of the magnetic resonance measurement to be monitored.

In act 242, the at least one position-dependent variation peak value $(|dB(r,t)/dt|_{PEAK}$ and/or the at least one maximum position-dependent variation average value $(|dB(r,t)/dt|_{RMS,MAX})$ is compared to at least one limit value $L_{PEAK}$, $L_{RMS}$ during monitoring of the temporal change in the magnetic field. If one of the two limit values is exceeded, in act 244, for example, the operating mode of the magnetic resonance device 10 is changed (e.g., the magnetic resonance device 10 is safely switched off). If the method is performed before a planned magnetic resonance measurement, then in act 244, a warning message may be output. According to the warning message, the at least one limit value $L_{PEAK}$, $L_{RMS}$ may be exceeded during the performance of the planned magnetic resonance measurement.

If it is established that the limit value has not been exceeded, in act 246, the magnetic resonance measurement is continued and/or no warning message output.

In FIG. 5, in act 331, a scaling factor $S_x$, $S_y$, $S_z$ is provided for at least one (e.g., each) of the plurality of gradient coils $18_x$, $18_y$, $18_z$. A maximum of the magnetic field distribution D(r) (e.g., of an amount of the magnetic field distribution D(r) of at least one (e.g., all) of the plurality of monitoring points P characterized by corresponding r positions is ascertained in order to ascertain the scaling factors $S_x$, $S_y$, $S_z$. The scaling factors may be shown as S vectors with the components $S_x$, $S_y$, $S_z$.

In act 332, a position-independent time-derivative value of the magnetic field dB(r)/dt is ascertained in order to ascertain the temporal change in the magnetic field for at least one (e.g., all) of the plurality of monitoring points P while a product is produced from the scaling factor S with the time derivative of the gradient value $\vec{G}(t)$.

In act 334, analogous to act 234, over a plurality of measurement times t, at least one position-independent variation average value $|dB(r)/dt|_{RMS}$ is ascertained based on the position-independent time-derivative value of the magnetic field dB(r)/dt.

In act 336, analogous to act 236, a maximum position-independent variation average value $|dB(r)/dt|_{RMS,MAX}$ of the at least one position-independent variation average value $|dB(r)/dt|_{RMS}$ is ascertained for at least one (e.g., all) of the measurement times t. In act 338, analogous to act 238, a position-independent variation peak value $|dB(r)/dt|_{PEAK}$ of the position-independent time-derivative value dB(r)/dt is ascertained for at least one (e.g., all) of the measurement times t. The aforementioned measurement times are advantageously within the period of the magnetic resonance measurement to be monitored.

In act 342, analogous to act 234, the at least one position-independent variation peak value $(|dB(r)/dt|_{PEAK}$ and/or the at least one maximum position-independent variation average value $(|dB(r,t)/dt|_{RMS,MAX})$ is compared to the at least one limit value $(L_{PEAK}, L_{RMS,MAX})$ during the monitoring of the temporal change in the magnetic field. If one of the two limit values is exceeded, in act 344, analogous to act 244, for example, the operating mode of the magnetic resonance device 10 is changed (e.g., the magnetic resonance device 10 is safely switched off). If the method is performed before a magnetic resonance measurement, in act 344, analogous to act 244, a warning message may then be output. According to this, the at least one limit value $L_{PEAK}$, $L_{RMS}$ may be exceeded during the performance of the planned magnetic resonance measurement.

The methods described above in detail and the evaluation unit and magnetic resonance device portrayed are only exemplary embodiments that may be modified in various ways by a person skilled in the art without departing from the scope of the invention. The use of the indefinite article "a" or "an" does not rule out the possibility that the features concerned may also be present several times. The term "unit" does not rule out the possibility that the components concerned consist of a plurality of interacting sub-components that may also be spatially distributed where applicable.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for monitoring a temporal change in a magnetic field in a magnetic resonance device with a plurality of gradient coils, the method comprising:
   providing a position-dependent magnetic field distribution produced by the plurality of gradient coils with a plurality of monitoring points;
   ascertaining time-dependent gradient values of the plurality of gradient coils;
   ascertaining a temporal change in the magnetic field based on the position-dependent magnetic field distribution and the time-dependent gradient values; and
   monitoring the temporal change in the magnetic field, the monitoring of the temporal change in the magnetic field comprising comparing the temporal change in the magnetic field with at least one limit value, the at least one limit value comprising a predetermined threshold value.

2. The method of claim 1, further comprising altering an operating mode of the magnetic resonance device, outputting a warning message, or altering the operating mode of the magnetic resonance device and outputting the warning message in the event of exceeding the at least one limit value.

3. The method of claim 1, wherein the plurality of monitoring points are at a distance of less than 10 cm from a housing of the magnetic resonance device that at least partially encloses a patient reception area.

4. The method of claim 1, wherein the position-dependent magnetic field distribution for at least one monitoring point of the plurality of monitoring points and for at least one gradient coil of the plurality of gradient coils comprises a magnetic field distribution vector characterizing a magnetic field that is produced by the respective gradient coil at the respective monitoring point.

5. The method of claim 4, wherein the position-dependent magnetic field distribution for each monitoring point of the plurality of monitoring points and for each gradient coil of the plurality of gradient coils comprises a magnetic field distribution vector characterizing a magnetic field that is produced by the respective gradient coil at the respective monitoring point.

6. The method of claim 4, wherein the position-dependent magnetic field distribution for at least one monitoring point of the plurality of monitoring points comprises a matrix, the matrix elements of which comprise components of the magnetic field distribution vectors.

7. The method of claim 6, wherein the position-dependent magnetic field distribution for each monitoring point of the plurality of monitoring points comprises a matrix, the matrix elements of which comprise components of the magnetic field distribution vectors.

8. The method of claim 1, further comprising measuring, for at least one gradient coil of the plurality of gradient coils, a time-dependent gradient current,
   wherein ascertaining the time-dependent gradient values comprises ascertaining the time-dependent gradient values based on the time-dependent gradient currents.

9. The method of claim 8, wherein the time-dependent gradient current is measured with the aid of at least one current sensor.

10. The method of claim 9, wherein the at least one current sensor comprises a magnetic field sensor.

11. The method of claim 1, wherein ascertaining the temporal change in the magnetic field for at least one monitoring point of the plurality of monitoring points comprises ascertaining a position-dependent time-derivative value of the magnetic field.

12. The method of claim 11, wherein for at least one monitoring point of the plurality of monitoring points, at least one position-dependent variation average value is ascertained based on the respective position-dependent time-derivative value of the magnetic field over a plurality of measurement times.

13. The method of claim 11, wherein for at least one monitoring point of the plurality of monitoring points, for at least one measurement time, or for a combination thereof, a position-dependent variation peak value of the position-dependent time-derivative value of the magnetic field, a maximum position-dependent variation average value of the at least one variation average value, or a combination thereof is ascertained.

14. The method of claim 13, wherein during monitoring of the temporal change in the magnetic field, the at least one position-dependent variation peak value, the at least one maximum position-dependent variation average value, or the at least one position-dependent variation peak value and the at least one maximum position-dependent variation average value are compared to the at least one limit value.

15. The method of claim 1, wherein a position-independent time-derivative value of the magnetic field is ascertained to ascertain the temporal change in the magnetic field for at least one monitoring point of the plurality of monitoring points.

16. The method of claim 15, wherein a scaling factor is provided to ascertain the position-independent time-derivative value for at least one gradient coil of the plurality of gradient coils, and
   wherein a maximum of the magnetic field distribution of at least one monitoring point of the plurality of monitoring points is ascertained to ascertain the scaling factors.

17. The method of claim 15, wherein at least one position-independent variation average value is ascertained based on the position-independent time-derivative value of the magnetic field over a plurality of measurement times.

18. The method of claim 15, wherein a position-independent variation peak value of the position-independent time-derivative value, a maximum position-independent variation average value of the at least one position-independent variation average value, or a combination thereof is ascertained for at least one measurement time.

19. The method of claim 18, wherein the at least one position-independent variation peak value, the at least one maximum position-independent variation average value, or the at least one position-independent variation peak value and the at least one maximum position-independent variation average value are compared to the at least one limit value during the monitoring of the temporal change in the magnetic field.

20. An evaluation unit with an arithmetic unit for monitoring a temporal change in a magnetic field in a magnetic resonance device with a plurality of gradient coils, the evaluation unit comprising:
a processor configured to:
ascertain time-dependent gradient values of various gradient coils; and
ascertain and compare a temporal change in a magnetic field with at least one limit value based on the ascertained time-dependent gradient values and a position-dependent magnetic field distribution provided, the at least one limit value comprising a predetermined threshold value.

21. A magnetic resonance device comprising:
an evaluation unit with an arithmetic unit for monitoring a temporal change in a magnetic field in a magnetic resonance device with a plurality of gradient coils, the evaluation unit comprising:
a processor configured to:
ascertain time-dependent gradient values of various gradient coils; and
ascertain and compare a temporal change in a magnetic field with at least one limit value based on the ascertained time-dependent gradient values and a position-dependent magnetic field distribution provided, the at least one limit value comprising a predetermined threshold value.

22. The magnetic resonance device of claim 21, further comprising at least one current sensor.

23. In a non-transitory computer-readable storage medium storing instructions executable by a programmable arithmetic unit of an evaluation unit to monitor a temporal change in a magnetic field in a magnetic resonance device with a plurality of gradient coils, the instructions comprising:
providing a position-dependent magnetic field distribution produced by the plurality of gradient coils with a plurality of monitoring points;
ascertaining time-dependent gradient values of the plurality of gradient coils;
ascertaining a temporal change in the magnetic field based on the position-dependent magnetic field distribution and the time-dependent gradient values; and
monitoring the temporal change in the magnetic field, the monitoring of the temporal change in the magnetic field comprising comparing the temporal change in the magnetic field with at least one limit value, the at least one limit value comprising a predetermined threshold value.

* * * * *